(12) United States Patent
Nishimura

(10) Patent No.: US 7,915,098 B2
(45) Date of Patent: Mar. 29, 2011

(54) METHOD OF FABRICATING DISPLAY DEVICE AND DISPLAY DEVICE

(75) Inventor: Teiichiro Nishimura, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/526,309

(22) Filed: Sep. 25, 2006

(65) Prior Publication Data

US 2007/0105255 A1 May 10, 2007

(30) Foreign Application Priority Data

Sep. 28, 2005 (JP) ................................. 2005-281117
Aug. 10, 2006 (JP) ................................. 2006-217706

(51) Int. Cl.
*H01L 21/00* (2006.01)

(52) U.S. Cl. .......... 438/149; 438/151; 438/164; 257/88; 257/E33.001

(58) Field of Classification Search .................. 438/149, 438/151, 164; 257/88, 79, 72, E33.001
See application file for complete search history.

(56) References Cited

U.S. PATENT DOCUMENTS

| | | | | |
|---|---|---|---|---|
| 5,989,693 | A * | 11/1999 | Yamasaki et al. | 428/216 |
| 6,512,250 | B1 * | 1/2003 | Koyama et al. | 257/98 |
| 6,903,377 | B2 * | 6/2005 | Yamazaki et al. | 257/88 |
| 7,202,927 | B2 * | 4/2007 | Murade | 349/138 |
| 2004/0137142 | A1 * | 7/2004 | Nishikawa | 427/66 |
| 2005/0258443 | A1 * | 11/2005 | Yamazaki et al. | 257/93 |
| 2006/0115983 | A1 * | 6/2006 | Fujii et al. | 438/640 |
| 2006/0121745 | A1 * | 6/2006 | Fujii | 438/790 |
| 2006/0192487 | A1 * | 8/2006 | Choi et al. | 313/512 |

FOREIGN PATENT DOCUMENTS

| | | |
|---|---|---|
| JP | 2004-039317 | 2/2004 |
| JP | 2004-127637 | 4/2004 |
| JP | 2004-302392 | 10/2004 |
| JP | 2005-190703 | 7/2005 |
| JP | 2005-203329 | 7/2005 |
| WO | 03/060858 | 7/2003 |

* cited by examiner

*Primary Examiner* — Asok K Sarkar
*Assistant Examiner* — Julia Slutsker
(74) *Attorney, Agent, or Firm* — Robert J. Depke; Rockey, Depke & Lyons, LLC

(57) ABSTRACT

A method of fabricating a display device having a TFT substrate and an array of plural light-emitting devices arranged on the substrate, each of the light-emitting devices having a lower electrode, an upper electrode, and organic layers sandwiched between the lower and upper electrodes, includes the steps of: arraying the light-emitting devices on a display region of the TFT substrate; bringing out external connector terminals from the light-emitting devices; placing the external connector terminals outside the display region on the TFT substrate while exposing surfaces of the external connector terminals; and selectively forming a protective film on the display region of the TFT substrate by a method of application such that at least the light-emitting devices are covered.

21 Claims, 5 Drawing Sheets

METHOD OF FABRICATING DISPLAY DEVICE AND DISPLAY DEVICE

CROSS REFERENCE TO RELATED APPLICATION

The invention contains subject matter related to Japanese Patent Applications JP 2005-281117 and JP 2006-217706 filed in the Japanese Patent Office on Sep. 28, 2005 and Aug. 10, 2006, respectively, the entire contents of which being incorporated herein by reference.

BACKGROUND OF THE INVENTION

1. Field of the Invention

The invention relates to a method of fabricating a display device and to the resulting display device and, more particularly, to a method of fabricating a display device equipped with organic electroluminescent devices (OEDs) and to the resulting display device.

2. Description of the Related Art

An organic electroluminescent device (OED) is composed of a lower electrode, an upper electrode, and organic layers sandwiched between the upper and lower electrodes. Each organic layer includes an emissive layer. OEDs have attracted attention as emissive devices capable of emitting high-intensity light with low-voltage DC drive.

An active-matrix-driven display device (i.e., an organic electroluminescent display) having such OEDs has thin-film transistors (TFTs) at each pixel on a substrate. OEDs constituting individual pixels are composed of a lower electrode patterned for each pixel and connected with the TFTs, organic layers formed on the lower electrode, and an upper electrode overlying the organic layers. Of these layers, the upper electrode is formed, for example, as a full-sized unpatterned film that covers plural pixels. The upper electrode is shared by plural pixels.

In such an active-matrix-driven display device, a sufficient level of aperture ratio can be effectively secured in the OEDs by constructing the device as a top emissive display. That is, light is taken out from the opposite side of the substrate.

A typical method of fabricating a top emissive display starts with preparing a TFT substrate made of an insulating material such as glass. OEDs are arranged on the display area of the substrate. Each OED is made of a lower electrode, an upper electrode, and organic layers sandwiched between the electrodes. External connector terminals are brought out from the OEDs and formed outside the display area on the substrate. Then, a protective film made, for example, of silicon nitride ($SiN_x$) is formed over the whole area of the substrate under this condition by chemical vapor deposition (CVD). The protective film may also be formed from silicon oxide ($SiO_2$) by the same CVD process.

Then, encapsulating resin is deposited over the protective film that is on the display area of the TFT substrate. Subsequently, a counter substrate made of an insulating material such as glass is placed opposite to the TFT substrate and aligned. The counter substrate is stuck to the TFT substrate such that the encapsulating resin is sandwiched between them. Subsequently, the encapsulating resin on the display area is cured, for example, by UV irradiation. The portions of the counter substrate which overlie the external terminal regions are removed by scribe dicing.

The portions of the protective film overlying the external terminal regions are then etched away by reactive ion etching (RIE) using $NF_3$ gas. Thus, the surfaces of the external connector terminals are exposed.

There is a report on an example of forming the end surface of the protective film along the end surface of the counter substrate by etching the protective film by the RIE process using the counter substrate as a mask (see, for example, JP-A-2004-127637 (patent reference 1)).

SUMMARY OF THE INVENTION

However, where the above-described protective film is formed by a CVD process as described previously, it may be necessary to remove the portions of the protective film overlying the external connector terminals after forming the protective film over the whole area of the substrate. This complicates the fabrication sequence. Furthermore, when the protective film is etched by an RIE process, in a case where $NF_3$ gas is used as the etchant gas as described previously, there is the problem that the fabrication cost is high because the $NF_3$ gas is expensive. In addition, the protective film made of $SiN_x$ may be removed by wet etching using a strong acid but there is the possibility that even the protective film overlying the display area is overetched. Further, where a film of $SiN_x$ is formed by a CVD process, poisonous monosilane is used as process gas and, therefore, the process equipment may require a device for detoxifying the process gas to prevent effects on the human body. In addition, a pumping system may also be necessary to adjust the pressure of the process environment. Consequently, the structure of the equipment is complex. This also increases the fabrication cost.

The film quality of the protective film made of $SiN_x$ is different according to different reaction conditions. For example, in a display device having a protective film (environmentally friendly $SiN_x$ film) to enhance the film density for preventing formation of dark spots due to ingress of moisture into the OEDs, for example, under high-temperature, high-humidity environments, generation and growth of the dark spots are suppressed when stored under high-temperature, high-humidity environments. However, increasing the film density increases the stress in the protective film, producing peeling of the film. This shortens the emission lifetime. On the other hand, where a protective film having low stress (life-prioritized $SiN_x$ film) is formed to prolong the emission lifetime, the emission life can be increased successfully but the film density of the protective film drops. Consequently, where the device is stored under high-temperature, high-humidity environments, dark spots are enlarged. Additionally, a technique for forming a protective film from lamination layers of the aforementioned environmentally friendly $SiN_x$ film and life-prioritized $SiN_x$ film according to the purpose has been discussed. However, the tact time is long. The process equipment is complicated and the cost is increased.

Therefore, it is difficult to fabricate a display device showing both long emission lifetime and long durability under high-temperature, high-humidity environments in a case where a protective film made of $SiN_x$ is used.

Accordingly, it is desirable to provide a method of fabricating a display device which can be fabricated using a simplified fabrication sequence at a reduced cost, has a long emission lifetime, and exhibits long durability even under high-temperature, high-humidity environments. It is also desirable to provide this display device.

A method of fabricating a display device free from the foregoing problems in accordance with one embodiment of the invention is used to fabricate the display device having a TFT substrate on which plural light-emitting devices are arranged. Each of the light-emitting devices has a lower electrode, an upper electrode, and organic layers sandwiched between the lower and upper electrodes. This method of fabrication starts with arraying the plural light-emitting devices on a display region of the TFT substrate. External connector terminals are brought out from the light-emitting devices. The external connector terminals are then placed outside the display region on the substrate such that the surfaces of the external connector terminal devices are exposed. Then, a protective film is selectively formed on the display region of the substrate by a method of application so as to cover at least the light-emitting devices.

A display device according to one embodiment of the invention is obtained by the aforementioned method of fabrication and has a TFT substrate, plural light-emitting devices arrayed on a display region of the substrate, external connector terminals brought out from the light-emitting devices, and a protective film applied over the display region of the substrate so as to cover at least the light-emitting devices. Each of the light-emitting devices has a lower electrode, an upper electrode, and organic layers sandwiched between the lower and upper electrodes. The external connector terminals are disposed outside the display region on the substrate.

According to this method of fabricating the display device, the protective film is selectively formed on the display region of the substrate by a method of application. Consequently, the surfaces of the external connector terminals are maintained exposed. This would make it unnecessary to etch away the portions of the protective film overlying the external connector terminals after formation of the protective film. Hence, the fabrication sequence is simplified. Furthermore, since the protective film is formed by the method of application, it may be unnecessary to use a poisonous process gas, unlike the case where a protective film of $SiN_x$ is formed by a CVD process as described previously. Also, it may be unnecessary to adjust the pressure of the process environment. This may make it unnecessary to install a device for detoxifying the process gas or pumping machine within the process equipment. In consequence, the structure of the equipment is simplified.

It has been confirmed that the display device having the protective film formed by a method of application in accordance with the aforementioned method of fabrication has longer emission lifetime and longer durability even under high-temperature, high-humidity environments than a display device having a protective film of $SiN_x$ fabricated by a CVD method as already described previously. This will be set forth in detail in the description of embodiments of the invention.

As described so far, according to the method of fabricating a display device according to an embodiment of the invention and the resulting display device, the fabrication sequence is simplified. The machine for fabricating the protective film is simplified. This shortens the tact time. In addition, the fabrication cost can be suppressed. Accordingly, the productivity can be improved. Furthermore, the display device has a long emission lifetime and shows long durability even under high-temperature, high-humidity environments and so images of high quality can be displayed.

DESCRIPTION OF THE PREFERRED EMBODIMENTS

Figure 1:
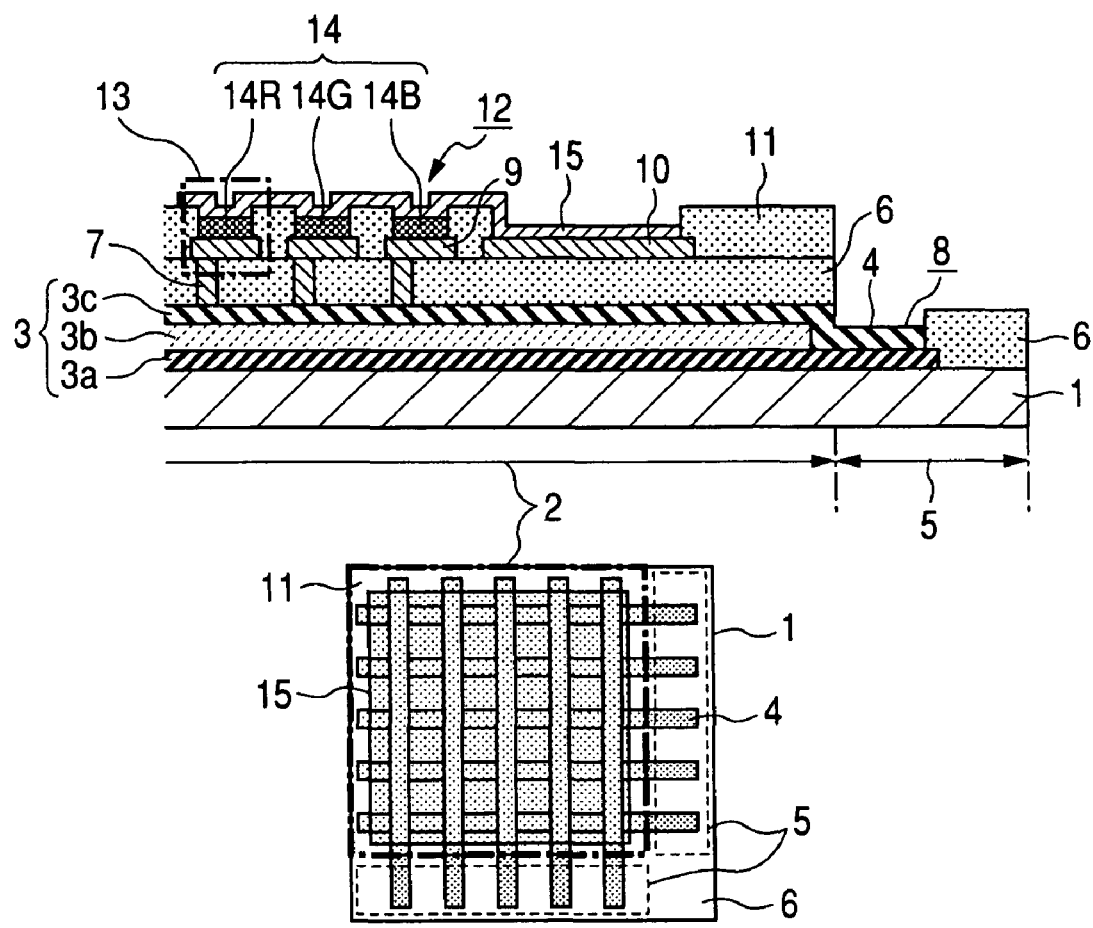
FIG. 1 is a cross-sectional view and a plan view of a main portion of a display device fabricated by a method of fabrication according to one embodiment of the invention, illustrating the embodiment.

Embodiments of the invention are hereinafter described in detail by referring to the drawings.

The structures of various members are described in detail in the order of its fabrication sequence while taking a top emissive, active-matrix organic EL display as an example.

First, as shown in FIGS. 1A and 1B, a driver circuit 3 is built on a display region 2 of a substrate 1 (hereinafter may be referred to also as the TFT substrate) made of an insulating material, for example, glass. This driver circuit 3 is used to drive organic EL devices (light-emitting devices) formed on the display region 2 in later process steps. The driver circuit 3 has a TFT circuit 3a made, for example, from molybdenum (Mo) and a TFT circuit 3c formed over the TFT circuit 3a via a TFT insulating film 3b. The TFT circuit 3c is made, for example, of aluminum (Al). Parts of the TFT circuit 3a and TFT circuit 3c are brought out as external connector terminals 4 onto portions on the substrate 1 which are located outside the display region 2. The region which is located outside the display region 2 and in which the external connector terminals 4 are formed is referred to as an external terminal region 5 herein. It is now assumed that the external terminal region 5 is formed along two sides forming one corner out of the four sides of the substrate 1 that is rectangular, for example.

A first insulator film 6 made of positive photosensitive polybenzoxazole is applied to the TFT substrate 1, for example, by spin coating, the driver circuit 3 being formed on the substrate 1. The first insulator film 6 acts as a planarizing film for evening out the irregularities formed on the surface of the substrate 1. In this embodiment, polybenzoxazole is used in the first insulator film 6. Other insulating material such as positive photosensitive polyimide may also be used.

Then, contact holes 7 for connection with the TFT circuit 3c are formed in the first insulator film 6 by exposing and developing the first insulator film 6. Openings 8 are formed in the first insulator film 6 that covers the external connector terminals 4 to expose the surfaces of the external connector terminals 4. Subsequently, the substrate 1 under this condition is baked in an environment of an inert gas such as nitrogen ($N_2$) to cure the first insulator film 6 made of polybenzoxyzole and to remove moisture contained in the first insulator film 6 or the like.

Then, a conductive material layer (not shown) is formed on the first insulator film 6 while filling in the contact holes 7. The conductive material layer (not shown) is produced by stacking a first ITO film, an Ag alloy film, and a second ITO film in this order from the side of the substrate 1. For example, the first ITO film, Ag alloy film, and second ITO film of the conductive material layer have thicknesses of about 30 nm, about 100 nm, and about 10 nm, respectively. The Ag alloy film will become a reflective layer for a lower electrode that will be formed by patterning the conductor material layer in a later process step.

The conductive material layer is then patterned using an etching process in which a resist pattern (not shown) is used as a mask, the resist pattern being formed by a normal lithography technique. Consequently, an array of lower electrodes (anodes) 9 is formed on the first insulator film 6 within the display region 2. The lower electrodes 9 are connected with the TFT circuit 3c via the contact holes 7 and correspond to individual pixels. An auxiliary interconnect 10 is formed on the first insulator film 6 over fringes of the display region 2. The auxiliary interconnect 10 has a width of about 3 mm and is shaped like a frame. The auxiliary interconnect is connected with a driver circuit (not shown). The auxiliary interconnect 10 is provided to improve the luminance and obtain good luminance distribution within a plane by connecting the auxiliary interconnect with upper electrodes formed in a later process step to reduce the interconnect resistivity. For this reason, the auxiliary interconnect is preferably made of an excellent conductive material. Preferably, the width of the auxiliary interconnect is increased as much as possible.

Then, a second insulator film 11 formed from positive photosensitive polybenzoxyzole is applied to the first insulator film 6, for example, by spin coating again, it being noted that the lower electrodes 9 and auxiliary interconnect 10 are formed on the first insulator film 6. Pixel apertures 12 for forming individual pixels within the display region 2, i.e., organic EL devices, are formed by exposing, developing, and curing the photosensitive film. The surfaces of the lower electrodes 9 are exposed. The surface of the auxiliary interconnect 10 is also exposed. In this embodiment, polybenzoxyzole is used as the second insulator film 11. Other insulator material such as positive photosensitive polyimide may also be used.

The substrate 1 under this condition is then baked under an environment of an inert gas such as $N_2$ to cure the polybenzoxyzole and to remove moisture contained in the first insulator film 6 and second insulator film 11.

Then, spin cleaning is done with DI water to remove minute foreign substances. Thereafter, the substrate is baked in a vacuum environment. The substrate is conveyed into a pretreatment chamber while maintaining the vacuum environment. The substrate 1 is pretreated with $O_2$ plasma. A next process step, i.e., evaporation of the organic layers, is performed while maintaining the vacuum environment as described later. Because a process as described so far is used, the process step performed after the baking is maintained in a vacuum environment. Consequently, adsorption of moisture within the atmosphere onto the substrate 1 is prevented with desirable results.

Then, organic layers 14 for different colors in the organic EL devices 13, i.e., red organic layer 14R, green organic layer 14G, and blue organic layer 14B, are formed on the lower electrodes 9 within the pixel apertures 12 (see above-referenced FIG. 1) while maintaining the vacuum environment.

At this time, light emitted from the emissive layer within each organic layer 14 preferably forms a resonant structure that resonates between the lower electrode 9 and an upper electrode (described later). The thicknesses of the organic layers 14 are set such that the optical distance L between the lower and upper electrodes assumes a positive minimum value within a range satisfying the requirement given by Eq. (1) below.

$$\frac{2L}{\lambda} + \frac{\Phi}{2\pi} = m \quad (1)$$

where m is an integer, $\Phi$ is a phase shift produced when reflection is made between the lower electrode 9 and the upper electrode, and $\lambda$ is the peak wavelength of the spectrum of light extracted from the upper electrode side.

In this case, the substrate 1 is conveyed into a chamber for depositing the blue organic layer 14B, for example, under a vacuum environment. An evaporation mask (not shown) is aligned on the substrate 1. The inner wall of the pixel apertures 12 whose lower electrodes 9 are exposed at the bottom is covered. Under this condition, a layer for injection of positive holes, a positive hole transport layer, an emissive layer, and an electron transport layer are successively deposited. Thus, the blue organic layer 14B is formed to a film thickness of about 200 nm.

Then, the substrate 1 is carried into a chamber for depositing the red organic layer 14R while maintaining the vacuum environment. A deposition mask (not shown) is aligned on the substrate 1 and the red organic layer 14R is formed to a film thickness of about 150 nm in the same way as the blue organic layer 14B.

Then, the substrate 1 is carried into a chamber for depositing the green organic layer 14G while maintaining the vacuum environment. A deposition mask (not shown) is aligned on the substrate 1 and the green organic layer 14G is formed to a film thickness of about 100 nm in the same way as the blue organic layer 14B.

After forming the organic layers 14 in this way, a deposition mask (not shown) is aligned on the substrate 1 while maintaining the vacuum environment. Electron injection layers (not shown) made, for example, of LiF are formed by an evaporation method to a film thickness of about 1 nm on the organic layers 14, on the second insulator film 11, and on the auxiliary interconnect 10. Then, the upper electrode 15 made, for example, of semipermeable MgAg alloy is formed to a film thickness of about 10 nm on the electron ejection layers, for example, by a vacuum evaporation method using the evaporation mask. In this way, the auxiliary interconnect 10 and upper electrode (cathode) 15 are connected via the electron ejection layers. In this embodiment, the lower electrode 9 is an anode, while the upper electrode 15 is a cathode. Alternatively, the lower electrode 9 may act as a cathode, whereas the upper electrode 15 may act as an anode.

In this way, an array of the organic EL devices 13 is formed on the display region 2 of the substrate 1, each EL device having the organic layers 14 sandwiched between the lower electrode 9 and upper electrode 15. The external connector terminals 4 brought out from the driver circuit 3 are exposed to the external terminal region 5.

Figure 2:
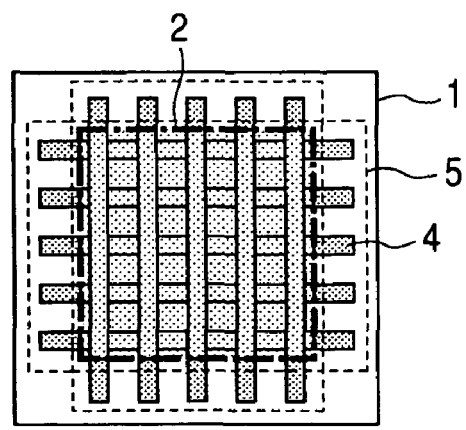
FIG. 2 is a plan view of a display device fabricated by a method according to an embodiment of the invention, illustrating the embodiment.

In the description provided here, the external terminal region 5 is formed near two sides forming one angle out of the four sides constituting the rectangular substrate 1. As shown in FIG. 2, external connector terminals 4 may be brought out from the driver circuit 3 (see above-referenced FIG. 1) on the substrate 1 and extend in directions along the four sides, respectively, of the substrate 1. The external terminal region 5 may be disposed to surround the display region 2.

Figure 3A:
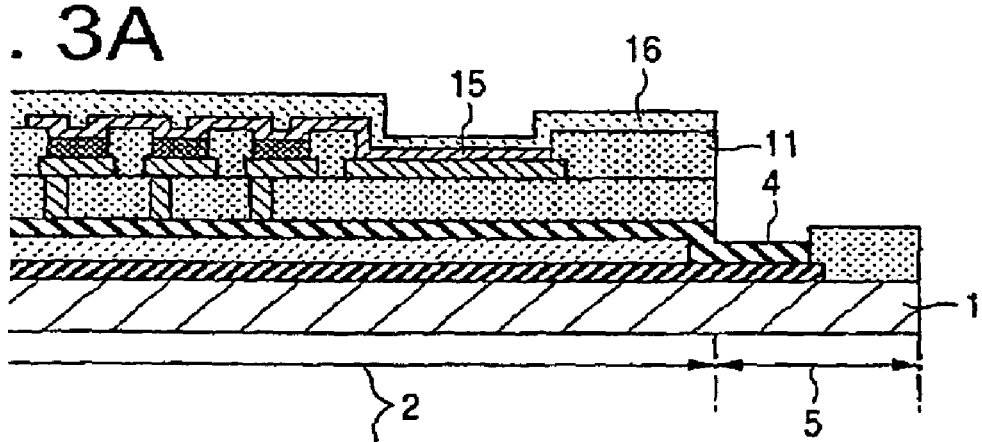
FIGS. 3A and 3C are cross-sectional views of a display device fabricated by a method according to an embodiment of the invention, illustrating the embodiment.

After forming the upper electrode 15 (see above-referenced FIG. 1) as described previously, a protective film 16 is selectively formed on the display region 2 of the substrate 1 to cover at least the upper electrode 15 by a method of application as shown in FIG. 3A. In this embodiment, it is assumed that the protective film 16 is formed to cover the whole display region 2.

The protective film 16 is made of an organic material. A preferable organic material used in the protective film 16 does not react with the constituent material of the upper electrode 15, shows an optical transmittance of more than 90% for light in the visible range, and exhibits good affinity with an encapsulating resin used in bonding together the TFT substrate 1 and a counter substrate in a later process step. A preferred example of this organic material is an organic material containing fluorine (such as FS-1010 and FS-7010 available from Fluoro Technology and EGC-1700 available from Sumitomo 3M Ltd.)

The optical transmittance of the environmentally friendly $SiN_x$ film described previously is 85% at 450 nm. The optical transmittance of the life-prioritized $SiN_x$ film is 80% at 450 nm. Where the optical transmittance of the protective film 16 to the visible region of light is higher than 90% as described previously, the optical transmittance of the protective film 16 is conspicuously high. Furthermore, as described later, it has been confirmed that organic EL displays using the protective film 16 of the present embodiment show high durability under high-temperature, high-humidity environments, have long emission lifetime, and exhibit high optical transmittance in the visible range of light (especially, wavelengths of blue light (400 nm to 450 nm)).

The protective film 16 is formed by the method described below. The substrate 1 on which the upper electrode 15 has been formed is put into an environment of $N_2$. A solution containing the organic material is applied to the upper electrode 15 and to the second insulator film 11, for example, by offset printing. The solvent is removed. As a result, the protective film 16 made of the organic material is selectively formed on only the display region 2. The surfaces of the portions of the external connector terminal 4 which overlie the external terminal region 5 are kept exposed.

In this embodiment, the protective film 16 is formed by offset printing. A technique relying on a method of application and permitting formation of a film and patterning to be carried out at the same time can be used. Examples of this technique include screen printing, roll-to-roll printing, and spray coating.

Figure 3B:
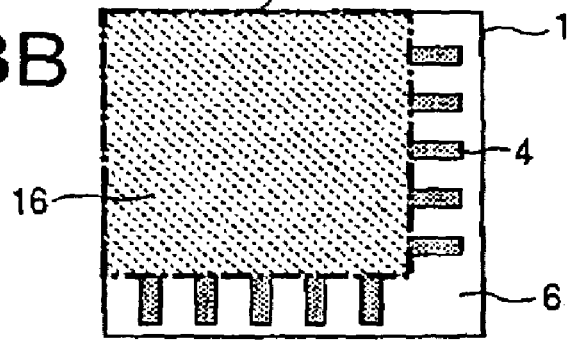
FIGS. 3B and 3D are plan views of the display device shown in FIGS. 3A and 3C, illustrating the sequence for fabricating the display device.
Figure 3C:
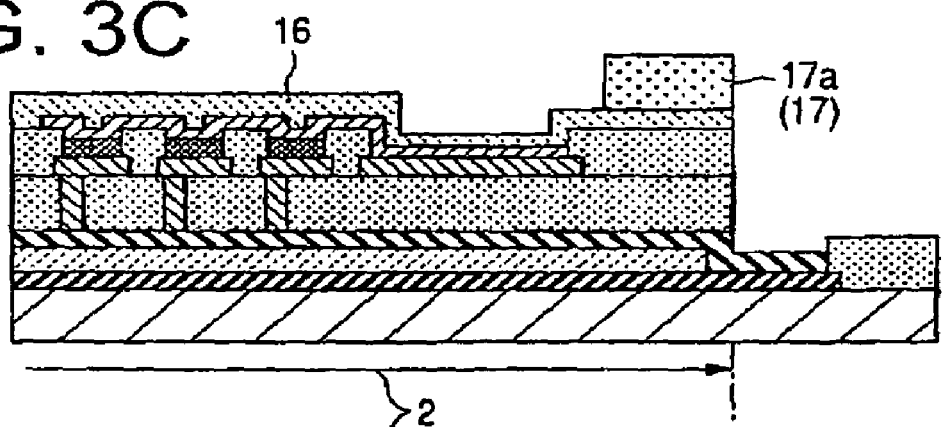
Figure 3D:
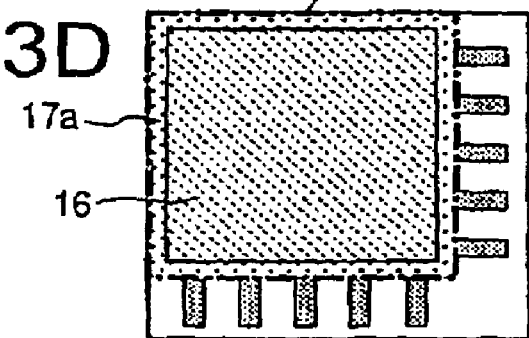

Then, as shown in FIG. 3B, a layer of encapsulating resin 17 is formed on the protective film 16. This layer of encapsulating resin 17 will be stuck to the counter substrate (described later). In the embodiment described here, the layer of encapsulating resin 17 is composed of a frame of sealing agent 17a and a filler 17b applied to a region surrounded by the sealing agent 17a. In the description of the present embodiment, the encapsulating resin 17 is applied to the side of the TFT substrate 1. The encapsulating resin may also be applied to the side of the counter substrate. The sealing agent 17a and filler 17b may be separately applied to the TFT substrate and counter substrate.

For example, the sealing agent 17a is applied to the fringes of the protective film 16 with a dispenser or by screen printing. An epoxy resin which has a viscosity of 100 Pa·s and which is cured, for example, by cationic photopolymerization reaction is used as the sealing agent 17a. During curing, polymerization of the cationic photopolymerizable epoxy resin is initiated by light such as UV light or visible light. The method of polymerization is cationic polymerization. The reactive functional group is epoxy group.

An epoxy group-containing compound having at least one epoxy group within any of the molecules given below can be used as the sealing agent 17a as long as the compound shows low oxygen permeability and water permeability and has desired adhesive force. Examples of the epoxy group-containing compound include bisphenol-A epoxy resin, bisphenol-F epoxy resin, biphenyl epoxy resin, phenolic novolac epoxy resin, cresol novolac epoxy resin, glycidyl ether epoxy resin, glycidyl amine epoxy resin, and modified epoxy resins. Any one type of the epoxy group-containing compounds may be used alone or two or more types may be used in combination.

Figure 4:
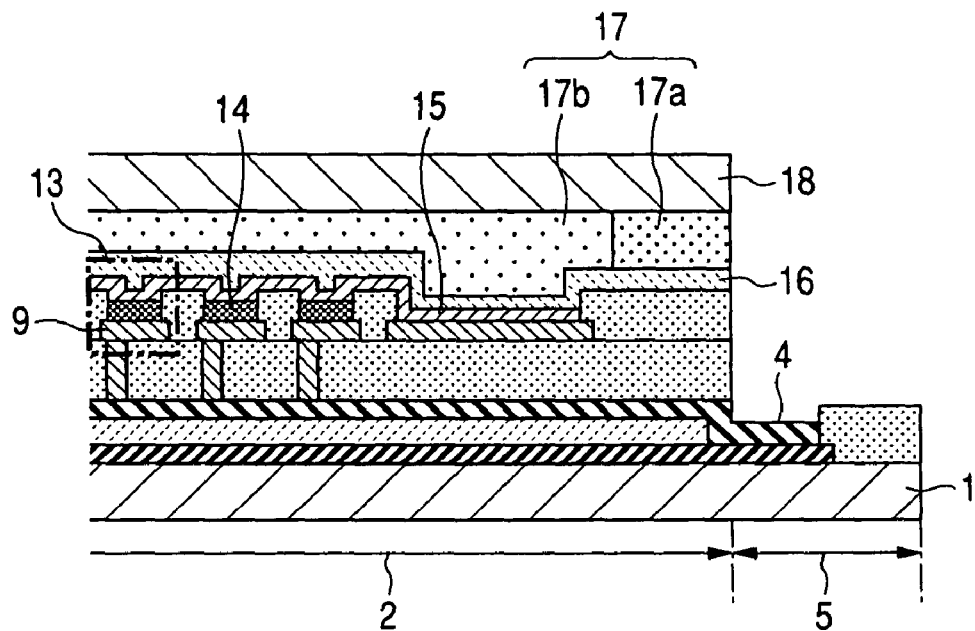
FIG. 4 is a cross-sectional view of a display device fabricated by a method according to an embodiment of the invention, illustrating the embodiment.

Then, as shown in FIG. 4, the filler 17b is dripped onto the region overlying the protective film 16 surrounded by the sealing agent 17a. Preferably, when the filler 17b is applied, it assumes a combination of plural patterns such as dot-like form, linear form, and wavy form such that no air bubbles are left after the TFT substrate 1 and the counter substrate have been bonded together. Preferably, the filler 17b has affinity with the sealing agent 17a. For example, an epoxy resin which has a viscosity of 0.8 Pa·s and is cured by a cationic photopolymerization reaction is used. During curing, polymerization of the cationic photopolymerizable epoxy resin is initiated by light such as UV light or visible light. The method of polymerization is cationic polymerization. The reactive functional group is epoxy group.

In order to extract light emitted from the organic EL devices 13, the transmittance in the visible range of light after curing or gelation is preferably higher than 80%. If no damage is given to the organic layers 14, an epoxy group-containing compound having at least one epoxy group within any one of the following molecules can be used. Examples of the epoxy group-containing compound include bisphenol-A epoxy resin, bisphenol-F epoxy resin, biphenyl epoxy resin, phenolic novolac epoxy resin, cresol novolac epoxy resin, glycidyl ether epoxy resin, glycidyl amine epoxy resin, and modified epoxy resins. Any one type of the epoxy group-containing compounds may be used alone or two or more types may be used in combination.

As the need arises, the epoxy resin used as the sealing agent 17a or filler 17b can contain an inorganic filler for improving the moisture permeability. The resin can contain a moisture absorbent material for preventing ingress of moisture. The resin can contain a spacer to control the height of coating. Furthermore, the resin can contain various kinds of additives such as adhesion-improving agent, reinforcing agent, softening agent, plasticizer, viscosity modifier, and sensitizer.

In the description of this embodiment, the frame-like region of sealing agent 17a is formed at the fringes of the protective film 16 that covers the display region 2, and the filler 17b is applied to the region overlying the protective film 16 and surrounded by the sealing agent 17a. The invention is not limited to this method. For example, a mask pattern (not shown) may be formed over the external terminal region 5 of the substrate 1 and then the encapsulating resin 17 may be deposited over the protective film 16. The counter substrate may be disposed opposite to the TFT substrate 1. The mask pattern and the portions of the counter substrate overlying the external terminal region 5 may be removed by performing a scribe-and-break process.

As described previously, after applying the filler 17b to the protective film 16 surrounded by the sealing agent 17a, the counter substrate 18 that is identical in shape with the TFT substrate 1 is placed on the sealing agent 17a and on the filler 17b while placed opposite to the TFT substrate 1. The sealing agent 17a and filler 17b are cured by light irradiation, thus encapsulating and hermetically sealing the substrates in resin. Alternatively, only the sealing agent 17a may be cured; the filler 17b may be gelated. Then, the portion of the counter substrate 18 which overlies the external terminal region 5 is removed by performing a scribe-and-break process.

In this embodiment, after the counter substrate 18 that is identical in shape with the TFT substrate 1 is bonded to the TFT substrate 1, the portion of the counter substrate 18 which overlies the external terminal region 5 is removed by performing a scribe-and-break process. The invention is not limited to this method. For example, the counter substrate 18 which is identical in shape with the display portion 2 of the TFT substrate 1 may be placed on the sealing agent 17a and on the filler 17b.

Because of the fabrication method described so far, a top emissive organic EL display which reflects light emitted from the emissive layers of the organic layers 14 by means of the lower electrodes 9 including the Ag alloy film and which produces output light from the upper electrodes 15 made of a semipermeable MgAg alloy can be obtained.

According to this method of fabricating a display device, the surfaces of the external connector terminals 4 are kept exposed by selectively forming the protective film 16 on the display region 2 of the TFT substrate 1 by a method of application. This would make it unnecessary to etch away the portion of the protective film 16 which overlies the external terminal region 5 after formation of the protective film 16. This results in simplification of the fabrication sequence. Furthermore, because the protective film 16 is formed by a method of application, it is not necessary to use a poisonous process gas or to adjust the pressure of the process environment, unlike the case where a protective film made of $SiN_x$ is formed by a CVD process as described previously. This may make it unnecessary to install a device for detoxifying the process gas or pumping machine within the process equipment. In consequence, the structure of the equipment is simplified. Hence, the tact time is shortened. The production cost can be reduced.

Figure 5:
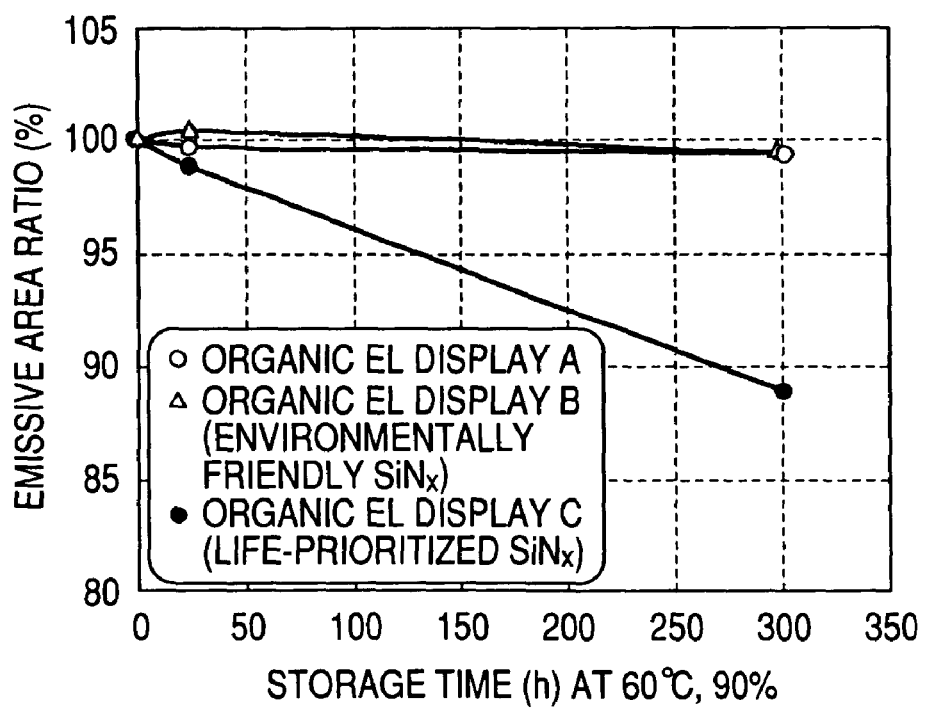
FIG. 5 is a graph showing aging variations of the emissive area ratio measured when display devices were stored under high-temperature, high-humidity environments.

FIG. 5 shows the aging variations of the emissive area ratio in a case where organic EL displays A of the above-described embodiment were stored under high-temperature, high-humidity environments having a temperature of 60° C. and a humidity of 90%. With respect to organic EL displays B using environmentally friendly $SiN_x$ having a high film density as the protective film 16 and organic EL displays C using life-prioritized $SiN_x$ having a low film density as the protective film 16 as described previously, the aging variations of the emissive area ratio were measured under the same conditions. FS-1010 (available from Fluoro Technology) that is an organic material containing fluorine was used as the organic material used in the protective film 16 of the organic EL displays A of the embodiment.

As shown in this graph, with respect to the organic EL displays A employing an embodiment of the invention, it has been confirmed that generation or growth of dark spots was not observed after a lapse of 300 hours but that good images were displayed. It has also been confirmed that even where FS-7010 (available from Fluoro Technology) and EGC-1700 (available from Sumitomo 3M Ltd.) which are fluorine-containing organic materials were used as organic materials used in the protective film 16, similar results (not shown) could be obtained. On the other hand, with respect to the organic EL displays B using a protective film made of an environmentally friendly $SiN_x$ not employing the invention, it has been confirmed that neither generation nor growth of dark spots was observed after a lapse of 300 hours and that good images were displayed, in the same way as the organic EL displays according to the embodiment of the invention. However, it has been confirmed that with respect to the organic EL displays C using a protective film made of the life-prioritized $SiN_x$ the emissive area ratio decreased with the elapse of time and the displayed image deteriorated.

Figure 6:
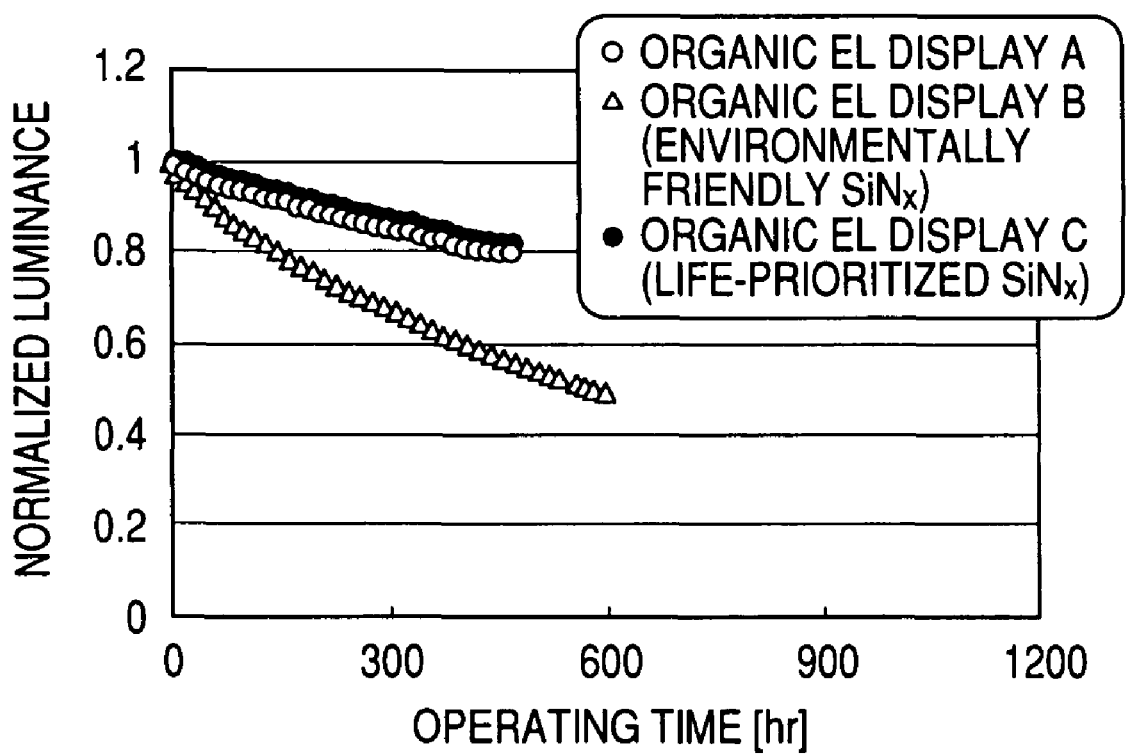
FIG. 6 is a graph showing measured aging variations of the luminance of display devices.

FIG. 6 is a graph showing the results of measurements of aging variations of the luminance of the organic EL displays A, B, and C. As shown in this graph, it has been confirmed that the organic EL displays A of the embodiment of the invention and the organic EL displays C using the protective film made of the life-prioritized $SiN_x$ have suffered from less deterioration of the luminance and has longer emission lifetime than the organic EL displays B using the protective film made of the life-prioritized $SiN_x$. With respect to the organic EL displays A, it has been confirmed that even where FS-7010 (available from Fluoro Technology) or EGC-1700 (available from Sumitomo 3M Ltd.) was used as the protective film 16, luminance deterioration was suppressed.

With respect to the organic EL displays B and C using protective films made of $SiN_x$, the optical transmittance in a wavelength range of 400 nm to 450 nm (blue light) was about 80%. It has been confirmed that the organic EL displays A employing an embodiment of the invention showed optical transmittances higher than 90% in the wavelength range of 400 nm to 450 nm.

The results described so far reveal that method of fabricating display devices and display devices according to embodiments of the invention can provide longer emission lifetimes, longer durability even under high-temperature, high humidity environments, and display high-quality images.

Modified Embodiment 1

Figure 7A:
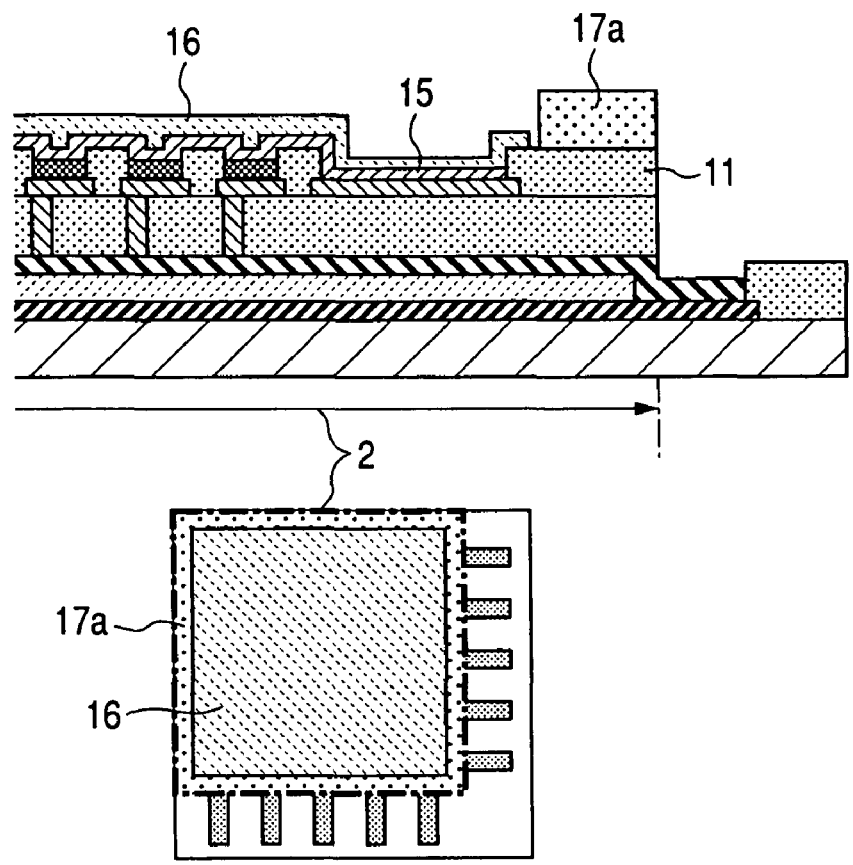
FIGS. 7A and 7B are cross-sectional views and a plan view of a display device fabricated by a method according to modified embodiment 1 of an embodiment of the invention, illustrating modified embodiment 1.
Figure 7B:
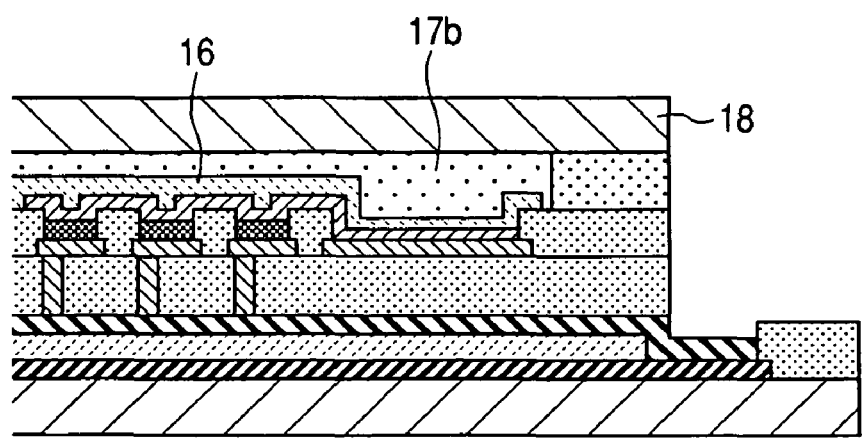

In one of the above-described embodiments, the protective film 16 is formed to cover the whole area of the display region 2. The sealing agent or sealant 17a is formed as a frame-like form on the fringes of the protective film 16. As shown in FIG. 7A, the sealing agent 17a may be deposited on the second insulator film 11 such that the protective film 16 provides a cover over the upper electrodes 15 but is somewhat smaller in area than the display region 2, and that the protective film 16 is surrounded by the sealing agent 17a. In this case, moisture or the like can be prevented from intruding from the ends of the protective film 16 which are exposed at the sides of the film. Consequently, generation of dark spots due to ingress of moisture can be suppressed with greater certainty. In addition, the thickness of the display device can be reduced by an amount corresponding to the thickness of the protective film 16 because the sealing agent 17a is deposited without via the protective film 16. Also, in this case, the counter substrate 18 and protective film 16 can be formed close to each other as shown in FIG. 7B. In consequence, a display device having some degree of reliability can be obtained even in cases where the filler 17b is not applied.

One of the above-described embodiments pertains to an example of top emissive display device. The invention can also be applied to a bottom emissive display device by forming the lower electrodes 9 from a transparent material such as ITO and forming the upper electrodes 15 from a reflective material including a metal such as Al. Additionally, the invention can be applied to a both side emissive display device having both surfaces from which output light is produced by forming the lower electrodes 9 and upper electrodes 15 from a transparent material.

In the description of the above-described embodiments, the display devices are of the active matrix type. The invention can also be applied to passive matrix displays.

It should be understood by those skilled in the art that various modifications, combinations, sub-combinations, and alternations may occur depending on design requirements and other factors insofar as they are within the scope of the appended claims or the equivalents thereof.

What is claimed is:

1. A method of fabricating a display device having a TFT substrate and an array of light-emitting devices arranged on the substrate, each of the light-emitting devices having a lower electrode, an upper electrode, and organic layers sandwiched between the lower and upper electrodes, the method comprising:

forming the light-emitting devices at a display region of the TFT substrate;

forming external connector terminals outside the display region and keeping surfaces of the external connector terminals exposed while selectively applying a protective film over the display region of the TFT substrate, but not in another region of the TFT substrate by a method of application such that at least the light-emitting devices are covered by the protective film without applying the protective film to the exposed connector terminals and wherein the protective film as originally applied is a continuous film covering the array of light emitting devices and the protective film is an organic material containing fluorine, and further wherein the external connector terminals are located at openings formed in an insulating film on which the light-emitting devices are formed and wherein auxiliary interconnects are formed on the insulating film adjacent to the light-emitting devices.

2. The method of fabricating a display device as set forth in claim 1, wherein the protective film is made of an organic material and a solvent, and whereby the protective film is applied via a coating method.

3. The method of fabricating a display device as set forth in claim 1, wherein the step of selectively applying the protective film is followed by the steps of interposing encapsulating resin between a counter substrate and the TFT substrate and bonding together the TFT substrate and the counter substrate.

4. The method of fabricating a display device as set forth in claim 3, wherein the step of interposing the encapsulating resin is carried out by forming a frame-like portion of a sealing agent only on fringe portions of the display region, applying a filler to a region within the frame-like portion of the sealing agent, and bringing together the TFT substrate and the counter substrate.

5. The method of fabricating a display device as set forth in claim 4, wherein in the step of applying the protective film, the protective film is formed over the whole of the display region of the TFT substrate, and wherein in the step of interposing the encapsulating resin, the frame-like portion of the sealing agent is formed on fringe portions of the protective film or over a region of the counter substrate corresponding to the fringe portions of the protective film.

6. The method of fabricating a display device as set forth in claim 4, wherein in the step of applying the protective film, the protective film is formed in a size (outermost bounds) smaller than the size (outermost bounds) of the display region of the TFT substrate, and wherein in the step of interposing the encapsulating resin, the frame-like portion of the sealing agent is formed outside the outer fringes of the protective film or over a corresponding region of the counter substrate corresponding to a position outside the outer fringes of the protective film.

7. A display device comprising:

an array of light-emitting devices formed at a display region of a substrate, each of the light-emitting devices having a lower electrode, an upper electrode, and organic layers sandwiched between the lower and upper electrodes;

external connector terminals connected to the light-emitting devices and disposed outside the display region; and a continuous protective film formed only over the display region of the substrate by a method of application such that at least the light-emitting devices are covered by the protective film not being applied to the exposed connector terminals and wherein the protective film as originally applied is a continuous film covering the array of light emitting devices and the protective film is an organic material containing fluorine, and further wherein the external connector terminals are located at openings formed in an insulating film on which the light-emitting devices are formed and wherein auxiliary interconnects are formed on the insulating film adjacent to the light-emitting devices.

8. The method of fabricating a display device as set forth in claim 1, wherein said protective film is applied only over said display region of the TFT substrate.

9. The method of fabricating a display device as set forth in claim 1, wherein said protective film has an optical transmittance in the blue wavelength range (400 to 450 nm) of over 90%.

10. The method of fabricating a display device as set forth in claim 1, wherein said protective film is applied by an offset printing method.

11. The method of fabricating a display device as set forth in claim 5, wherein said protective film is applied only over said display region of the TFT substrate.

12. The method of fabricating a display device as set forth in claim 5, wherein said protective film has an optical transmittance in the blue wavelength range (400 to 450 nm) of over 90%.

13. The method of fabricating a display device as set forth in claim 5, wherein said protective film is applied by an offset printing method.

14. The method of fabricating a display device as set forth in claim 6, wherein said protective film is applied only over said display region of the TFT substrate.

15. The method of fabricating a display device as set forth in claim 6, wherein said protective film has an optical transmittance in the blue wavelength range (400 to 450 nm) of over 90%.

16. The method of fabricating a display device as set forth in claim 6, wherein said protective film is applied by an offset printing method.

17. The display device as set forth in claim 7, wherein said protective film has an optical transmittance in the blue wavelength range (400 to 450 nm) of over 90%.

18. The display device as set forth in claim 7, wherein said protective film is applied by an offset printing method.

19. The display device as set forth in claim 7, wherein said protective film is formed over the entire the display region of the substrate.

20. The method of fabricating a display device as set forth in claim 1, wherein the protective layer extends over an upper electrode that is over an auxiliary interconnect, the protective layer extending up to an upper surface of a second insulating layer formed over a first insulating within which connections to the light emitting devices are made.

21. The method of fabricating a display device as set forth in claim 20, wherein the protective layer does not extend beneath a frame sealing structure that is formed on the second insulating layer.

* * * * *